United States Patent
Adusumilli et al.

(10) Patent No.: US 11,056,382 B2
(45) Date of Patent: Jul. 6, 2021

(54) CAVITY FORMATION WITHIN AND UNDER SEMICONDUCTOR DEVICES

(71) Applicant: GLOBALFOUNDRIES U.S. Inc., Santa Clara, CA (US)

(72) Inventors: Siva P. Adusumilli, South Burlington, VT (US); Steven M. Shank, Jericho, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 291 days.

(21) Appl. No.: 15/924,444

(22) Filed: Mar. 19, 2018

(65) Prior Publication Data
US 2019/0287847 A1    Sep. 19, 2019

(51) Int. Cl.
| | |
|---|---|
| *H01L 29/78* | (2006.01) |
| *H01L 21/762* | (2006.01) |
| *H01L 23/48* | (2006.01) |
| *H01L 21/768* | (2006.01) |

(52) U.S. Cl.
CPC .. *H01L 21/76283* (2013.01); *H01L 21/76256* (2013.01); *H01L 21/76275* (2013.01); *H01L 21/76898* (2013.01); *H01L 23/481* (2013.01)

(58) Field of Classification Search
CPC .. G01J 5/20; G01J 2005/206; G01J 2005/202; G01J 5/024; H01J 37/3171; H01J 2237/31701; H01L 37/00; H01L 21/2007; H01L 21/76264; H01L 21/76289; H01L 21/76275; H01L 21/76283
See application file for complete search history.

(56) References Cited

U.S. PATENT DOCUMENTS

| | | | | |
|---|---|---|---|---|
| 4,661,832 A | * | 4/1987 | Lechaton | H01L 21/3065 257/506 |
| 4,710,794 A | * | 12/1987 | Koshino | H01L 21/187 257/501 |

(Continued)

OTHER PUBLICATIONS

Taraschi, et al., "ained-Si-on-Insulator (SSOI) and SiGe-on-Insulator (SGOI): Fabrication Obstacles and Solutions", Mat. Res. Soc. Symp. Proc. vol. 745 © 2003 Materials Research Society.

(Continued)

*Primary Examiner* — Mary A Wilczewski
*Assistant Examiner* — Tsz K Chiu
(74) *Attorney, Agent, or Firm* — Thompson Hine LLP; Francois Pagette

(57) ABSTRACT

Structures with a cavity beneath semiconductor devices and methods associated with forming such substrates. A first semiconductor layer is formed on a first side of a first handle wafer. A device structure is formed that is arranged at least in part in the first semiconductor layer. After forming the device structure, the first handle wafer is thinned from a second side of the first handle wafer opposite to the first side of the first handle wafer in order to form a second semiconductor layer from the first handle wafer. After thinning the first handle wafer, a cavity is formed in the second semiconductor layer. The cavity is arranged in the second semiconductor layer beneath the device structure. A second handle wafer is attached to the second semiconductor layer to close the cavity.

20 Claims, 7 Drawing Sheets

(56) References Cited

U.S. PATENT DOCUMENTS

| | | | | |
|---|---|---|---|---|
| 5,389,569 A | * | 2/1995 | Cambou | H01L 21/76264 257/E21.564 |
| 5,943,581 A | * | 8/1999 | Lu | H01L 27/10858 257/E21.65 |
| 5,949,144 A | * | 9/1999 | Delgado | H01L 21/76264 257/776 |
| 6,551,944 B1 | * | 4/2003 | Fallica | H01L 21/76232 148/33.2 |
| 6,940,089 B2 | | 9/2005 | Cheng et al. | |
| 7,009,273 B2 | * | 3/2006 | Inoh | H01L 21/76283 257/499 |
| 7,053,747 B2 | * | 5/2006 | Joodaki | H01F 17/0006 257/531 |
| 7,919,814 B2 | * | 4/2011 | Goto | B81C 1/00246 257/350 |
| 8,198,734 B2 | | 6/2012 | Anderson et al. | |
| 8,409,989 B2 | | 4/2013 | Pei et al. | |
| 8,575,690 B1 | * | 11/2013 | Hsieh | H01L 29/407 257/334 |
| 8,610,211 B2 | * | 12/2013 | Furukawa | H01L 21/84 257/347 |
| 9,349,793 B2 | * | 5/2016 | Jaffe | H01L 29/78666 |
| 9,726,547 B2 | | 8/2017 | Liu et al. | |
| 9,899,527 B2 | * | 2/2018 | Purakh | H01L 29/78603 |
| 10,461,152 B2 | * | 10/2019 | Stamper | H01L 29/0649 |
| 2002/0081821 A1 | * | 6/2002 | Cabuz | B81C 1/0015 438/455 |
| 2004/0058506 A1 | * | 3/2004 | Fukuzumi | H01L 21/764 438/422 |
| 2005/0104067 A1 | | 5/2005 | Chu et al. | |
| 2006/0138541 A1 | * | 6/2006 | Nakamura | H01L 29/78687 257/347 |
| 2009/0166761 A1 | | 7/2009 | Curatola et al. | |
| 2011/0248374 A1 | * | 10/2011 | Akin | H01L 27/14683 257/470 |
| 2013/0320459 A1 | * | 12/2013 | Shue | H01L 27/088 257/392 |
| 2014/0353725 A1 | * | 12/2014 | Adkisson | H01L 29/737 257/197 |
| 2015/0187639 A1 | * | 7/2015 | Huang | H01L 21/76283 257/506 |
| 2015/0194416 A1 | * | 7/2015 | Cheng | H01L 21/3081 257/368 |
| 2015/0348825 A1 | * | 12/2015 | Hebert | H01L 21/76283 257/522 |
| 2017/0250253 A1 | * | 8/2017 | Toia | H01L 21/02381 |
| 2018/0083098 A1 | * | 3/2018 | Goktepeli | H01L 27/1203 |

OTHER PUBLICATIONS

Stamper, et al., "Radio Frequency Switches with Air Gap Structures" filed Jul. 10, 2017 as U.S. Appl. No. 15/645,655.

Adusumilli et al., "Sealed Cavity Structures with a Planar Surface" filed Jan. 22, 2018 as U.S. Appl. No. 15/876,727.

* cited by examiner

CAVITY FORMATION WITHIN AND UNDER SEMICONDUCTOR DEVICES

BACKGROUND

The present invention relates to semiconductor device fabrication and integrated circuits and, more specifically, to structures with a cavity beneath semiconductor devices and methods associated with forming such substrates.

Bulk silicon substrates are less costly than silicon-on-insulator (SOI) substrates. Generally, an SOI wafer includes a thin device layer of semiconductor material, a handle substrate, and a thin buried oxide (BOX) layer, physically separating and electrically isolating the device layer from the handle substrate. Devices fabricated using SOI technologies may exhibit certain performance improvements in comparison with comparable devices built directly in a bulk silicon substrate. For example, a bulk silicon substrate is characterized by poor device isolation and devices built on a bulk silicon substrate tend to exhibit high junction capacitances.

Improved structures that provide the advantages of an SOI substrate absent the cost and methods of forming such structures are needed.

SUMMARY

In an embodiment of the invention, a structure includes a first semiconductor layer, a device structure arranged at least in part in the first semiconductor layer, and a handle wafer. The structure further includes a second semiconductor layer between the handle wafer and the first semiconductor layer, and a bonding layer configured to attach the handle wafer to the second semiconductor layer. A cavity is arranged between the handle wafer and the first semiconductor layer. The cavity extends completely through the second semiconductor layer and is surrounded by the second semiconductor layer. The cavity has an arrangement in the second semiconductor layer beneath the device structure.

In an embodiment of the invention, a method includes forming a first semiconductor layer on a first side of a first handle wafer, and forming a device structure arranged at least in part in the first semiconductor layer. After forming the device structure, the first handle wafer is thinned from a second side of the first handle wafer opposite to the first side of the first handle wafer in order to form a second semiconductor layer from the first handle wafer. After thinning the first handle wafer, a cavity is formed in the second semiconductor layer that is arranged in the second semiconductor layer beneath the device structure. A second handle wafer is attached to the second semiconductor layer to close the cavity.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
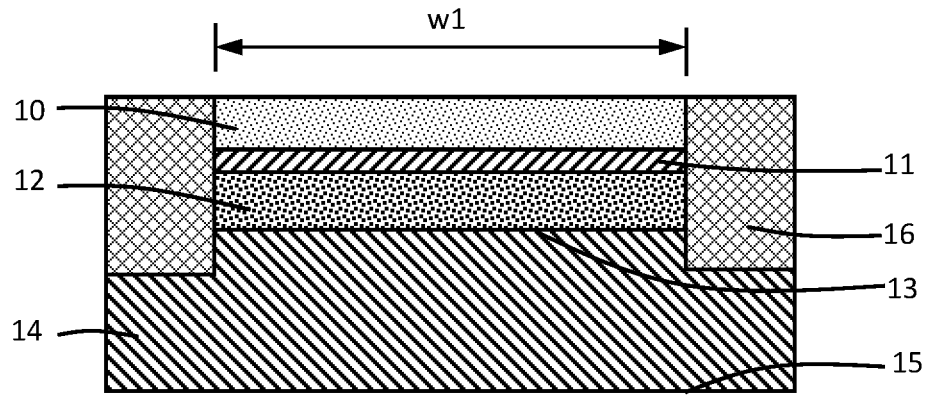
FIGS. 1-7 are cross-sectional views of a structure at successive fabrication stages of a processing method in accordance with embodiments of the invention.

With reference to FIG. 1 and in accordance with embodiments of the invention, semiconductor layers 10, 11, 12 are formed over a handle wafer 14. The handle wafer 14 may be a bulk wafer comprised of single-crystal silicon, and may have a front side 13 and a back side separated from the front side 13 by a given thickness. The semiconductor layer 12 is epitaxially grown over the front side 13 of the handle wafer 14 using the handle wafer 14 as a template or growth seed, the semiconductor layer 11 is epitaxially grown over the semiconductor layer 12 using the semiconductor layer 12 as a growth seed, and the semiconductor layer 10 is epitaxially grown over the semiconductor layer 11 using the semiconductor layer 11 as a growth seed. The semiconductor layers 10, 11, 12 may be formed using a low temperature epitaxial (LTE) growth process, such as vapor phase epitaxy (VPE). During epitaxial growth, the semiconductor material constituting the semiconductor layers 10, 11, 12 will acquire the crystal orientation and crystal structure of the single-crystal semiconductor material of the respective growth seed, which serves as an epitaxial growth template establishing a crystal structure. The semiconductor layer 11 may function as a buffer layer that is present to limit the propagation of defects during epitaxial growth upward from semiconductor layer 12 into the semiconductor layer 10.

The semiconductor layer 12 may be composed of a semiconductor material, such as silicon-germanium (SiGe), that can be etched selective to the semiconductor material (e.g., silicon) of the semiconductor layers 10, 11 and to the semiconductor material of the handle wafer 14 (e.g., silicon), and that is lattice mismatched with the handle wafer 14 due to the composition difference. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. In an embodiment, the semiconductor layer 12 may be composed of silicon-germanium with a germanium content ranging from twenty percent (20%) to thirty-five percent (35%), which selectively etches at a higher etch rate than silicon.

Shallow trench isolation regions 16 are formed that penetrate completely through the semiconductor layers 10, 11, 12 and to a shallow depth in the handle wafer 14 at its front side 13. The shallow trench isolation regions 16 may be composed of a dielectric material, such as an oxide of silicon (e.g., silicon dioxide ($SiO_2$)), deposited by chemical vapor deposition (CVD) into trenches etched by a masked etching process. The shallow trench isolation regions 16 may be arranged and interconnected to surround an active region of the semiconductor layer 10 in which one or more device structures may be formed. By extending in a vertical direction completely through a thickness of each of the semiconductor layers 10, 11, 12, the shallow trench isolation regions 16 also establish a set of lateral dimensions for the semiconductor layers 10, 11, 12 in a plane normal to the vertical direction. Of this set of lateral dimensions, a shared width, w1, of the semiconductor layers 10, 11, 12 is shown in FIG. 1.

Figure 2:
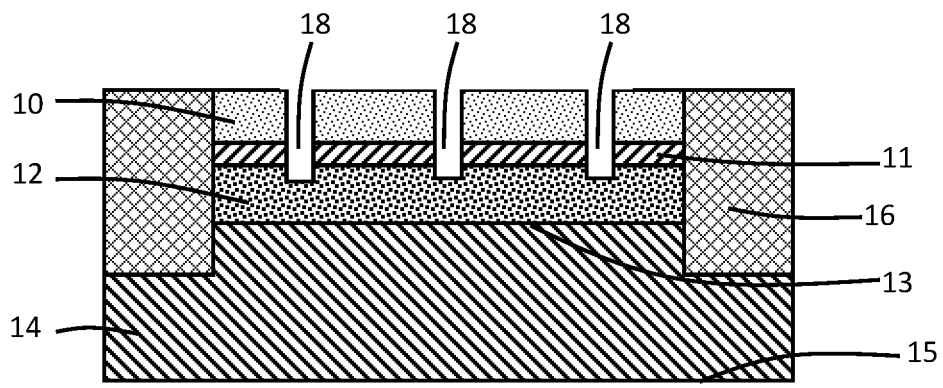

With reference to FIG. 2 in which like reference numerals refer to like features in FIG. 1 and at a subsequent fabrication stage of the processing method, openings 18 are formed that penetrate completely through the semiconductor layers 10, 11 and past the interface between the semiconductor layers 11, 12 to a shallow depth in the semiconductor layer 12. The openings 18 may be formed by a lithography and etching process that removes the semiconductor layers 10, 11 selective to the semiconductor layer 12 such that the semiconductor layer 12 functions as an etch stop.

Figure 3:
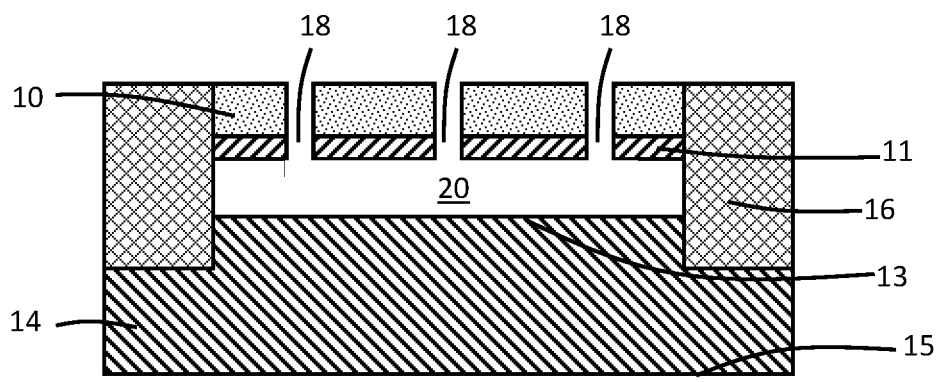

With reference to FIG. 3 in which like reference numerals refer to like features in FIG. 2 and at a subsequent fabrication stage of the processing method, the section of the semiconductor layer 12 arranged interior of the shallow trench isolation regions 16 may be completely removed by an etching process that removes the semiconductor material of the semiconductor layer 12 selective to the semiconductor material of the semiconductor layers 10, 11 and the dielectric material of the shallow trench isolation regions 16. This section of the semiconductor layer 12 is replaced by a cavity 20 of identical shape and dimensions that is arranged interior of the shallow trench isolation regions 16 and that is arranged vertically between the semiconductor layers 10, 11 and the handle wafer 14. The cavity 20 has lateral dimensions (e.g., width) that are equal to the lateral dimensions of the semiconductor layers 11, 12.

Figure 4:
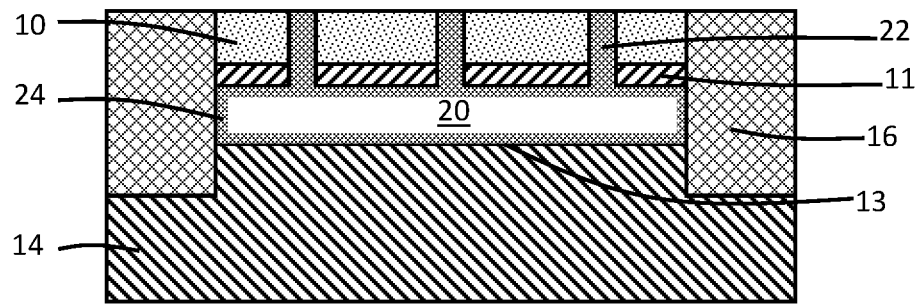

With reference to FIG. 4 in which like reference numerals refer to like features in FIG. 3 and at a subsequent fabrication stage of the processing method, after the cavity 20 is formed, the openings 18 may be closed and sealed with the formation of plugs 22. In an embodiment, the plugs 22 may be formed by depositing a dielectric material, such as an oxide of silicon like silicon dioxide ($SiO_2$) deposited by chemical vapor deposition (CVD), and then planarizing with, for example, chemical mechanical polishing (CMP). A thin layer 24 of the deposited dielectric material may also form on and coat the interior surfaces of the cavity 20 before the openings 18 are occluded by the plugs 22.

Figure 5:
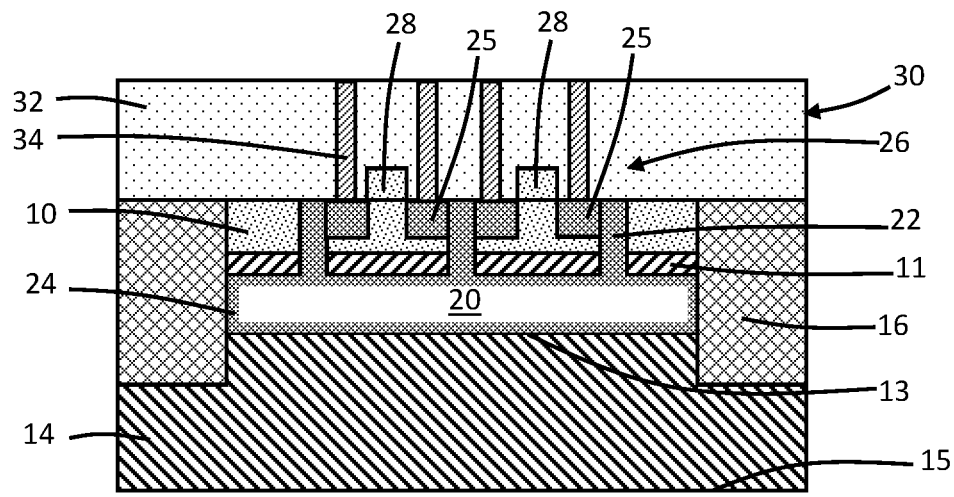

With reference to FIG. 5 in which like reference numerals refer to like features in FIG. 4 and at a subsequent fabrication stage of the processing method, a device structure 26 is formed in the device region including the semiconductor layers 10, 11 by a front-end-of-line (FEOL) fabrication process. For example, the device structure 26 may be a switch field-effect transistor that includes multiple gate fingers 28 having a parallel arrangement in rows over the active region and connected together at one end. Each gate finger 28 may include a gate electrode and a gate dielectric formed by depositing a layer stack and patterning the layer stack with photolithography and etching. The gate electrode may be composed of a conductor, such as doped polycrystalline silicon (i.e., polysilicon), and the gate dielectric may be composed of an electrical insulator, such as silicon dioxide ($SiO_2$). The device structure 26 may include other elements such as source/drain regions 25, halo regions, and lightly doped drain (LDD) extensions in the active region, as well as non-conductive spacers formed on the vertical sidewalls of the gate fingers. In an embodiment, the source/drain regions 25 may contain an n-type dopant (e.g., arsenic (As) or phosphorus (P)) selected from Group V of the Periodic Table to produce n-type conductivity, and the remainder of the semiconductor layer 12 may contain a p-type dopant (e.g., boron B)) selected from Group III of the Periodic Table to produce a well having p-type conductivity.

Middle-of-line (MOL) and back-end-of-line (BEOL) processing follow, which includes formation of an interconnect structure, generally indicated by reference numeral 30, that includes one or more dielectric layers, such as an interlayer dielectric layer 32, that are formed over the handle wafer 14 and metallization formed in the dielectric layers, such as contacts 34 in the interlayer dielectric layer 32 that extend vertically to, for example, the source/drain regions 25 of the device structure 26.

Figure 6:
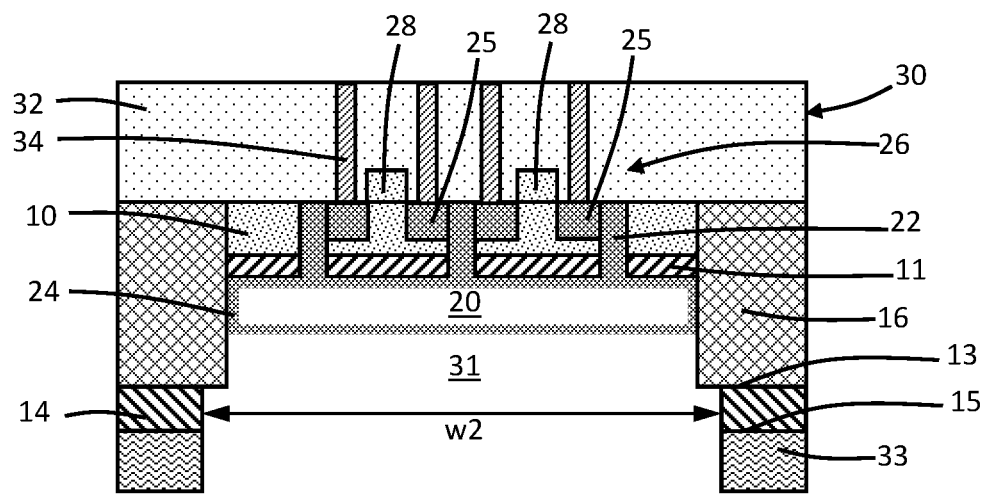

With reference to FIG. 6 in which like reference numerals refer to like features in FIG. 5 and at a subsequent fabrication stage of the processing method, the handle wafer 14 may be thinned by grinding, polishing, and/etching from the back side opposite to the front side on which the device structure 26 and interconnect structure 30 are formed. A sacrificial substrate (not shown) may be temporarily bonded to the interconnect structure 30 at the front side in order to permit mechanical handling during the backside processing thinning the handle wafer 14. The thinning reduces the thickness of the handle wafer 14 such that the front side 13 and the back side 15 are separated by a smaller distance in the vertical direction.

After thinning, a masked etch of the handle wafer 14 may be performed that forms a cavity 31 in the handle wafer 14 that extends completely through the thickness of the handle wafer 14. To that end, an etch mask 33 is formed by lithography at the backside of the thinned handle wafer 14. The etch mask 33 may include a layer of a light-sensitive material, such as an organic photoresist, applied by a spin coating process, pre-baked, exposed to light projected through a photomask, baked after exposure, and developed with a chemical developer. The etch mask 33 may also include an anti-reflective coating and a spin-on hardmask, such as an organic planarization layer (OPL), that are patterned along with the patterned photoresist. The etching process forming the cavity 31 may remove the material of the handle wafer 14 selective to the material of the dielectric layer 24 surrounding the cavity 20, which blocks etching of the overlying semiconductor layers 10, 11 and plugs 22. The cavity 31 is arranged in the thinned handle wafer 14 directly beneath the device structure 26. The dielectric layer 24 includes a membrane that separates the cavity 20 from the newly-formed cavity 31. Through selection of the location and dimensions of the opening in the etch mask 33, the cavity 31 has lateral dimensions (e.g., width) that are greater than the lateral dimensions of the semiconductor layers 11, 12 of the active region in which the device structure 26 is formed and greater than the lateral dimensions of the cavity 20. For example, the cavity 31 may have a width, w2, that is greater than the width, w1, of the active region (FIG. 1) and the cavity 20. The etch mask 33 is stripped after the cavity 31 is formed.

Figure 7:
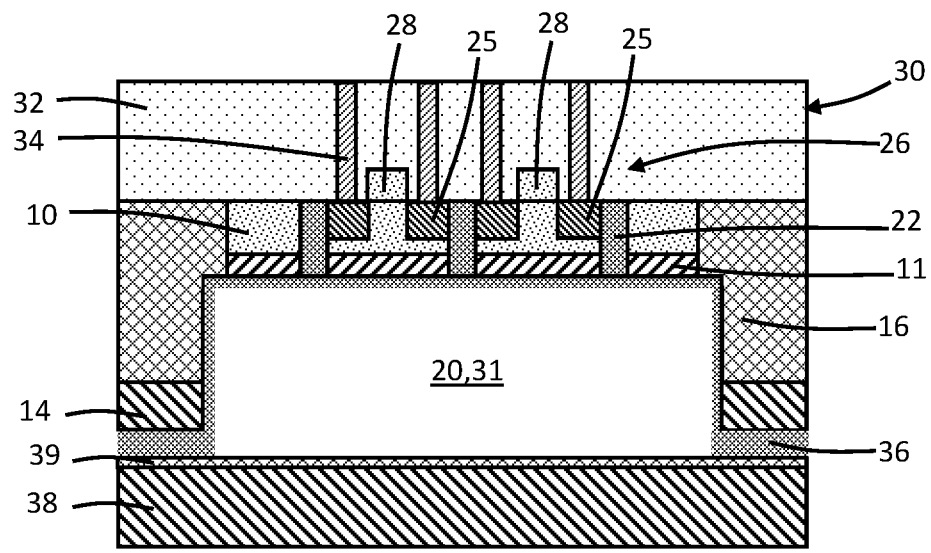

With reference to FIG. 7 in which like reference numerals refer to like features in FIG. 6 and at a subsequent fabrication stage of the processing method, the dielectric layer 24 is removed with a timed etching process. The removal of the dielectric layer 24 merges the cavity 20 with the cavity 31 to form a continuous stack of open spaces that is bifurcated into open spaces of different lateral dimensions. The timed etching process may also concurrently widen the cavity 20 by laterally etching the shallow trench isolation regions 16.

In an embodiment, shallow trench isolation regions 16 and the dielectric layer 24 may each be composed of an oxide of silicon and may have the same or similar etch rates during the timed etching process. The lateral dimensions (e.g., width) of the widened cavity 20 are greater than the lateral dimensions (e.g., width w1 (FIG. 1)) of the semiconductor layers 11, 12 of the active region in which the device structure 26 is formed.

Following the etching process, a dielectric layer 36 is formed that coats the surfaces surrounding the cavities 20, 31 and the backside surface of the remaining thickness of the handle wafer 14 and, in particular, that covers the semiconductor layer 11 to connect the plugs 22. The dielectric layer 36 may be composed of a dielectric material, such as silicon dioxide ($SiO_2$) deposited by chemical vapor deposition (CVD).

The thinned handle wafer 14 defines a semiconductor layer that surrounds the cavity 31 and the cavity 31 penetrates completely through the thinned handle wafer 14. Another handle wafer 38 may be attached by a bonding layer 39 to the section of the dielectric layer 36 covering the handle wafer 14 to generate an assembly. In an embodiment, the handle wafer 38 is indirectly attached to the handle wafer 14 by the bonding layer 39 due to the presence of the dielectric layer 36. In an embodiment, the handle wafer 38 is directly attached to the dielectric layer 36 by the bonding layer 39. In an embodiment in which the bonding layer 39 is composed of an adhesive (e.g., a layer of a polyimide adhesive), the handle wafer 38 may be adhesively bonded to the dielectric layer 36 and the handle wafer 14 to create an assembly. The handle wafer 38 may be composed of silicon, glass, quartz, sapphire, or another material, and is thicker than the thinned handle wafer 14.

The handle wafer 38, through its attachment to the thinned handle wafer 14, closes and seals the merged cavities 20, 31 to form an airgap that may be characterized by a permittivity or dielectric constant of near unity (i.e., vacuum permittivity). The airgap inside the closed and sealed merged cavities 20, 31 may be filled by atmospheric air at or near atmospheric pressure, may be filled by another gas at or near atmospheric pressure, or may contain atmospheric air or another gas at a sub-atmospheric pressure (e.g., a partial vacuum). The airgap inside the closed and sealed merged cavities 20, 31 contributes to providing full isolation of the device structure 26.

The airgap inside the closed and sealed merged cavities 20, 31 is arranged in a vertical direction between the handle wafer 38 and the semiconductor layers 10, 11. The airgap inside the closed and sealed merged cavities 20, 31 is arranged in a horizontal direction interior of the handle wafer 38 and the trench isolation regions 16, which surround the airgap. A section of the dielectric layer 36 is arranged between the handle wafer 38 and the handle wafer 14 exterior of the airgap and surrounds a portion of the airgap as well, and another section of the dielectric layer 36 coats the surfaces arranged about the cavities 20, 31. The portion of the airgap correlated with cavity 31, which is large in dimensions compared with conventional airgaps, may be effective to reduce the junction capacitance. The portion of the airgap correlated with cavity 20 may operate to further enlarge the airgap and to further reduce the junction capacitance.

Figure 8:
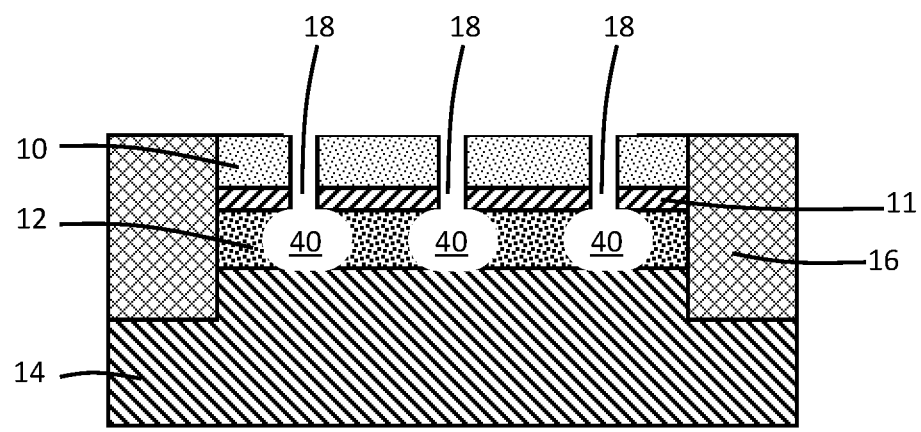
FIG. 8-9 are cross-sectional views of a structure at a successive stages of a processing method in accordance with alternative embodiments of the invention.

With reference to FIG. 8 in which like reference numerals refer to like features in FIG. 7 and in accordance with an alternative embodiment of the processing method, the section of the semiconductor layer 12 arranged interior of the shallow trench isolation regions 16 may only be partially removed by an etching process that removes the semiconductor material of the semiconductor layer 12 selective to the semiconductor material of the semiconductor layers 10, 11 and the dielectric material of the shallow trench isolation regions 16. Individual cavities 40 are formed inside the semiconductor layer 12 using an isotropic etching process and are arranged vertically between the semiconductor layers 10, 11 and the handle wafer 14. The cavities 40 may be discrete as shown in the representative embodiment, or may be merged. In an embodiment, the cavities 40 extend through the lower surface of the semiconductor layer 12, which provides a planar interface with the upper surface of the handle wafer 14.

Figure 9:
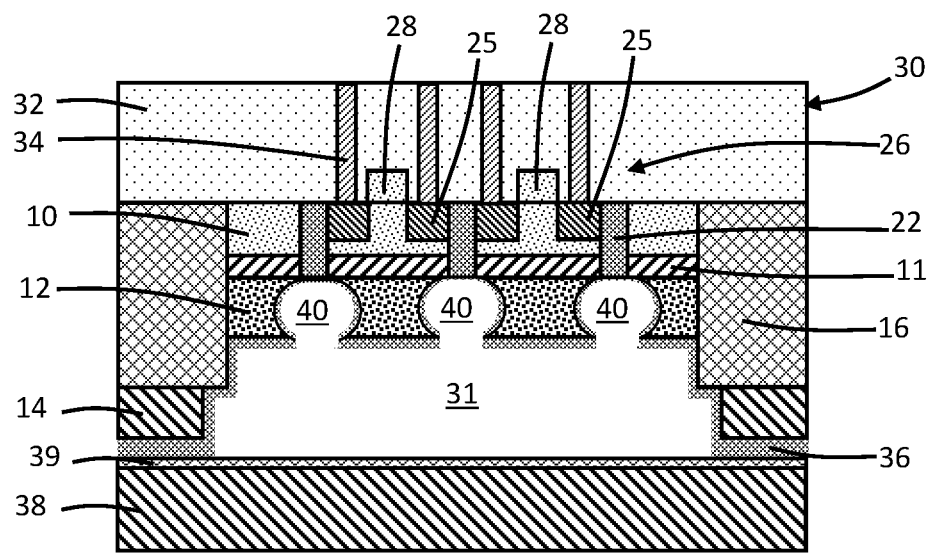

With reference to FIG. 9 in which like reference numerals refer to like features in FIG. 8 and at a subsequent fabrication stage of the processing method, after the cavities 40 are formed, the openings 18 may be closed and sealed with plugs 22, which coats the interior surfaces of the cavities 40 with the dielectric layer 24. Processing continues as described in connection with FIGS. 5-7. In connection with the formation of the cavity 31, the etching process may stop on the semiconductor material of the semiconductor layer 12, which has a different composition than the semiconductor layers 10, 11 and associated selectivity to the etching process forming the cavity 31. Although not shown, the dielectric layer 36 may also deposit on the surfaces surrounding the cavities 40.

The closed and sealed merged cavities 31, 40 define an airgap that is arranged in a vertical direction between the handle wafer 38 and the semiconductor layers 10, 11. The airgap inside the closed and sealed merged cavities 31, 40 is arranged in a horizontal direction interior of the handle wafer 38 and the trench isolation regions 16, which surround the airgap. A section of the dielectric layer 36 is arranged between the handle wafer 38 and the handle wafer 14 exterior of the airgap and surrounds a portion of the airgap as well, and another section of the dielectric layer 36 coats the surfaces arranged about the cavities 31, 40.

Figure 10:
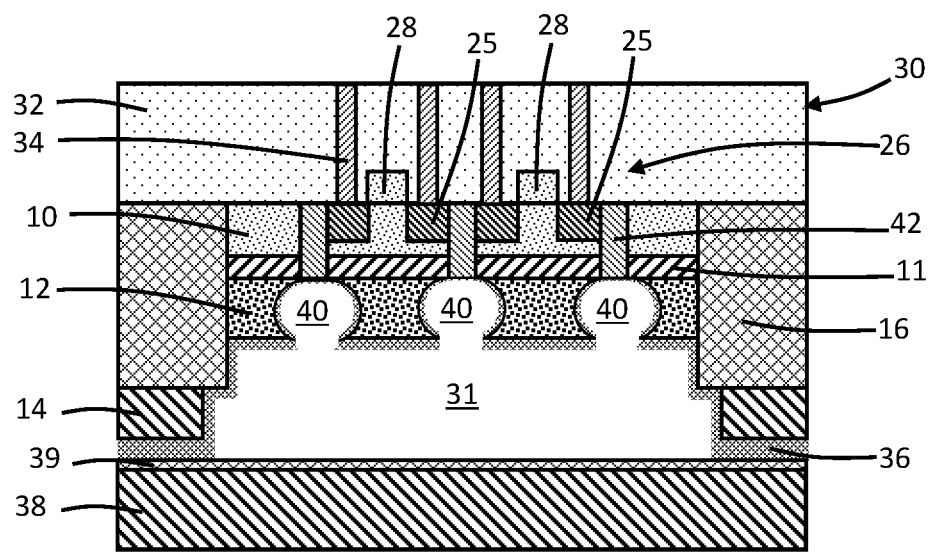
FIG. 10 is a cross-sectional view of a structure at a fabrication stage of a processing method in accordance with alternative embodiments of the invention.

With reference to FIG. 10 in which like reference numerals refer to like features in FIG. 9 and in accordance with an alternative embodiment of the processing method, the semiconductor layer 12 may be selectively etched to form the cavities 40, and a different type of plugs 42 may be formed to close and seal the openings 18 after the cavities 40 are formed. The plugs 42 may be formed by epitaxially growing a thin conformal layer composed of a semiconductor material, such as silicon-germanium (SiGe), as a liner on the surfaces of the semiconductor layers 10, 11, 12 bordering the openings 18 and cavities 40, and then epitaxially growing a thicker semiconductor layer composed of a different semiconductor material (e.g., silicon) than the thin conformal layer. During epitaxial growth of the thicker semiconductor layer, the thin conformal layer reflows and combines with the semiconductor material of thicker semiconductor layer to form the plugs 42 arranged inside the openings 18. The semiconductor material of the thicker semiconductor layer may also provide an additive epitaxial layer on the top semiconductor layer 10 and may be composed of the same semiconductor material (e.g., silicon) as the semiconductor layer 10. After the cavities 40 are formed and the openings 18 are closed and sealed with plugs 42, and processing continues as described in connection with FIGS. 5-7.

Figure 11:
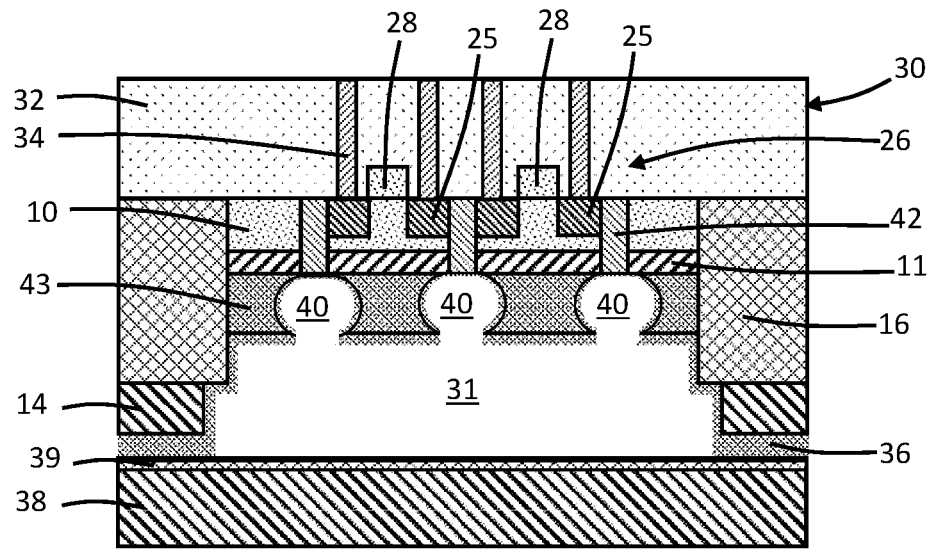
FIG. 11 is a cross-sectional view of a structure at a fabrication stage of a processing method in accordance with alternative embodiments of the invention.

With reference to FIG. 11 in which like reference numerals refer to like features in FIG. 10 and in accordance with an alternative embodiment of the processing method, the remaining semiconductor material of the partially-removed semiconductor layer 12 surrounding the cavities 40 may be converted to a layer 43 of dielectric material after the plugs 42 (or alternatively, plugs 22), device structure 26, interconnect structure 30, and the cavity 31 are formed, but before the dielectric layer 36 is formed on the surfaces surrounding the cavities 31, 40. In an embodiment, the remaining semiconductor material of the partially-removed semiconductor layer 12 may be oxidized and converted to an oxide containing silicon and germanium by a dry or wet thermal oxidization process that may be conducted at a low temperature. In an embodiment, the plugs 42 may also be converted to a dielectric material (e.g., an oxide) by the oxidation process. After the conversion is performed, processing continues as described in connection with FIG. 7.

Figure 12:
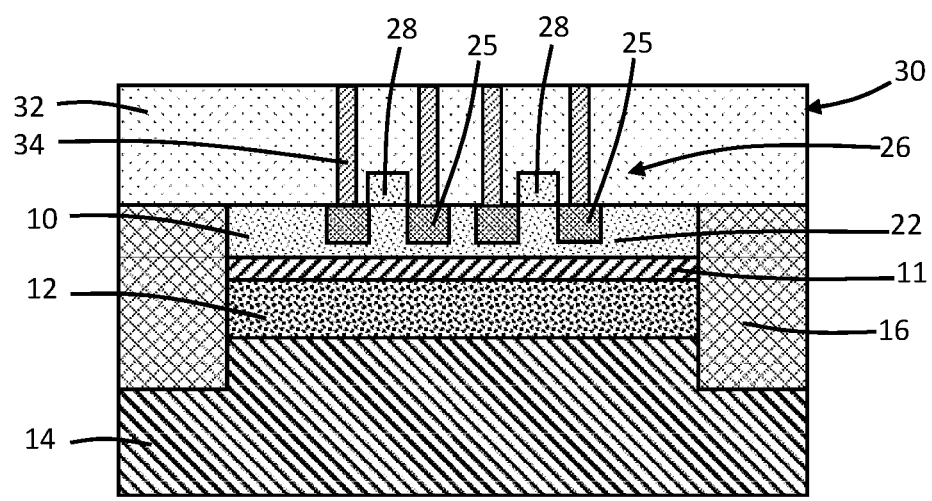
FIGS. 12 and 13 are cross-sectional views of structures at a fabrication stage of a processing method in accordance with alternative embodiments of the invention.

With reference to FIG. 12 in which like reference numerals refer to like features in FIG. 1 and in accordance with an alternative embodiment of the processing method, the formation of the openings 18 and cavity 20 may be omitted, and processing may be performed as described in connection with FIG. 5 such that the semiconductor layer 12 is intact before the handle wafer 14 is thinned.

Figure 13:
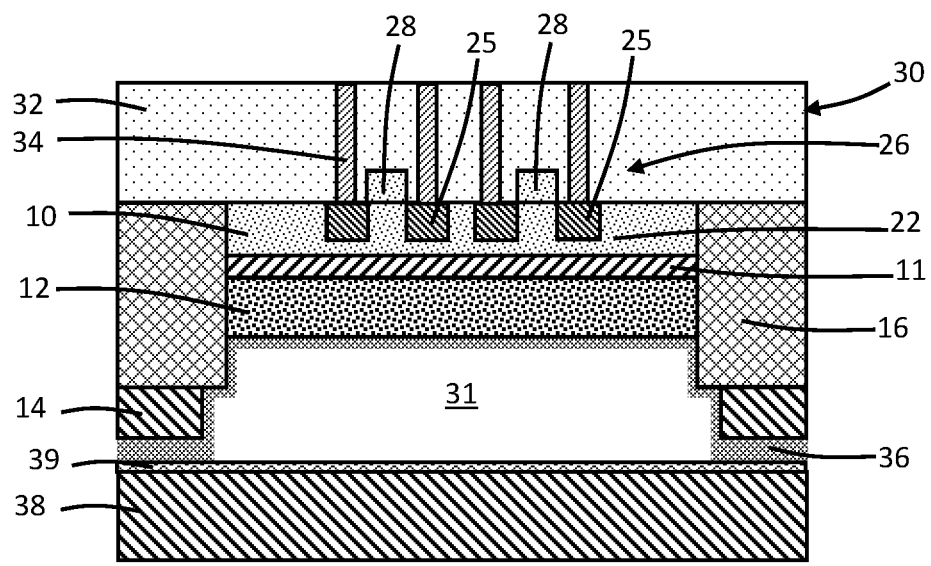

With reference to FIG. 13 in which like reference numerals refer to like features in FIG. 12 and at a subsequent fabrication stage of the processing method, in connection with the formation of the cavity 31 after the thinning of the handle wafer 14, the masked etching process removing the handle wafer 14 to form the cavity 31 may stop on the semiconductor material of the semiconductor layer 12, which has a different composition than the semiconductor layers 10, 11 and associated selectivity to the etching process removing the handle wafer 14 to form the cavity 31. In an alternative embodiment, the semiconductor layer 12 may be converted (e.g., oxidized) to dielectric material (e.g., silicon dioxide) as described in connection with FIG. 10.

Figure 14:
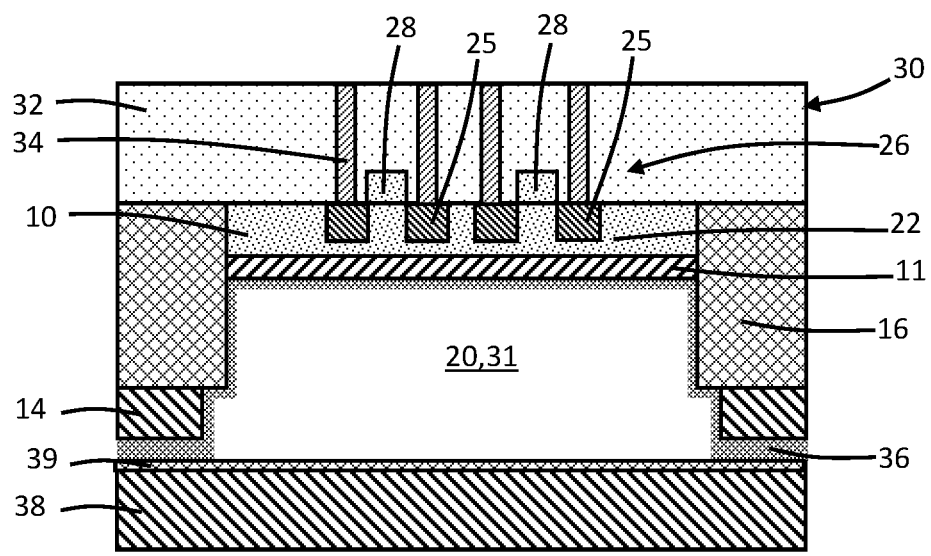
FIG. 14 is a cross-sectional view of a structure at a fabrication stage of a processing method in accordance with alternative embodiments of the invention.

With reference to FIG. 14 in which like reference numerals refer to like features in FIG. 12 and in accordance with an alternative embodiment of the processing method, the semiconductor layer 12 may be removed with an etching process selective to the materials of the semiconductor layer 11 and the handle wafer 14 to form the cavity 20 after the cavity 31 is formed, and before the dielectric layer 36 is formed and the handle wafer 38 is attached. The cavities 20, 31 are merged to form the airgap.

Figure 15:
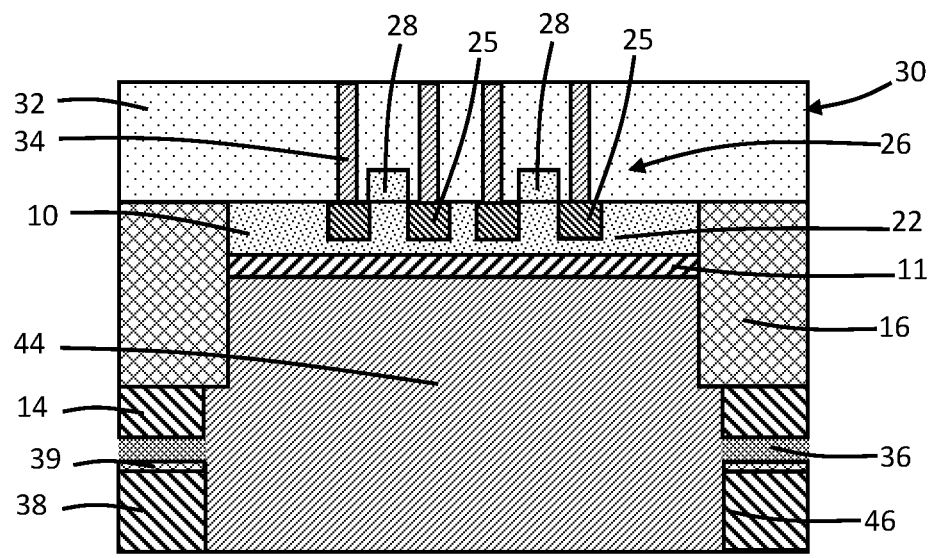
FIGS. 15 and 16 are cross-sectional views of structures at a fabrication stage of a processing method in accordance with alternative embodiments of the invention.
Figure 16:
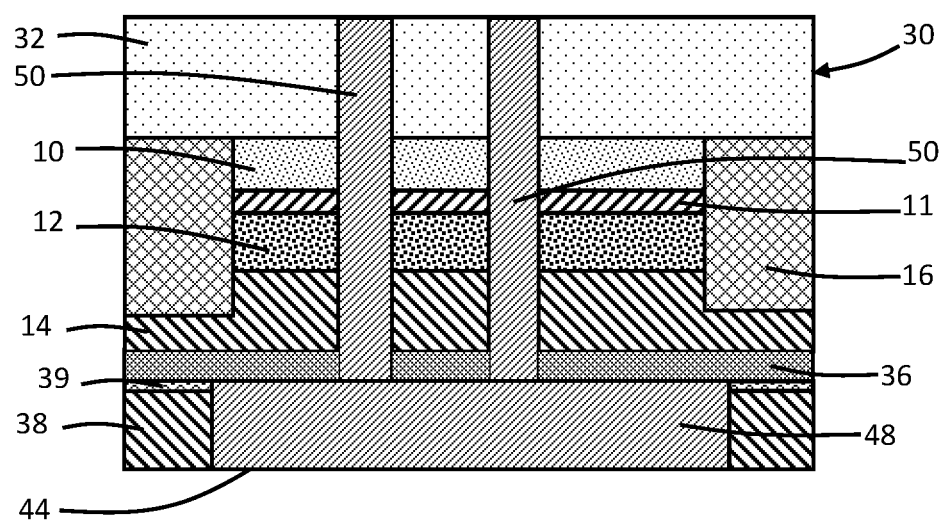

With reference to FIGS. 15 and 16 in which like reference numerals refer to like features in FIG. 14 and in accordance with an alternative embodiment of the processing method, the cavities 20, 31 may be filled with a section of a conductor layer 44 formed by forming an opening 46 in the handle wafer 38 and depositing and polishing the conductor layer 44 to fill the adjoined cavities 20, 31 and opening 46. The conductor layer 44 inside the cavities 20, 31 and opening 46 may be a conformal layer that includes a seam and encapsulated void (not shown) that are formed during deposition as a result of the large dimensions of the adjoined cavities 20, 31 and opening 46. In alternative embodiments, the conductor layer 44 may be formed in connection with any of the embodiments of FIGS. 8-11. The conductor layer 44 may be used to providing biasing that, for example, can alter the threshold voltage of the device structure 26.

As best shown in FIG. 16, a section of the conductor layer 44 may fill another opening 48 formed in the handle wafer 38 at a different location and may contact one or more through-silicon vias (TSVs) 50. The TSVs 50 provide vertical electrical connections that pass through the interconnect structure 30, semiconductor layers 10, 11, 12, thinned handle wafer 14, and dielectric layer 36 to establish electrical connections from one face to an opposite face. The TSVs 50 may be fabricated during BEOL processing by etching deep vias extending into the handle wafer 14, filling the vias with a conductor, and then exposing the conductor by a backside reveal process when the handle wafer 14 is thinned. The same etch mask may be used to form the openings in the different sections of the handle wafer 38 for the sections of the conductor layer 44.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first semiconductor layer;
a device structure arranged at least in part in the first semiconductor layer;
a handle wafer;
a second semiconductor layer arranged between the handle wafer and the first semiconductor layer;
a dielectric layer including a section arranged between the handle wafer and the second semiconductor layer;
a bonding layer configured to attach the handle wafer to the section of the dielectric layer;
a first cavity arranged between the handle wafer and the first semiconductor layer, the first cavity extending completely through the second semiconductor layer and the section of the dielectric layer, and the first cavity having an arrangement in the second semiconductor layer beneath the device structure.

2. The structure of claim 1 wherein the second semiconductor layer is a thinned handle wafer, and the handle wafer is thicker than the thinned handle wafer.

3. The structure of claim 1 wherein the bonding layer comprises an adhesive.

4. The structure of claim 1 further comprising:
a conductor layer inside the first cavity.

5. The structure of claim 1 wherein the second semiconductor layer and the section of the dielectric layer surround a first portion of the first cavity, and further comprising:
a plurality of trench isolation regions extending through the first semiconductor layer, the plurality of trench isolation regions surrounding the first semiconductor layer and a second portion of the first cavity, and the second portion of the first cavity and the plurality of trench isolation regions have equal lateral dimensions.

6. The structure of claim 1 wherein the second semiconductor layer and the section of the dielectric layer surround a first portion of the first cavity, and further comprising:
a plurality of trench isolation regions extending through the first semiconductor layer, the plurality of trench isolation regions surrounding the first semiconductor layer and a second portion of the first cavity, and the second portion of the first cavity and the plurality of trench isolation regions have different lateral dimensions.

7. The structure of claim 1 wherein a third semiconductor layer is arranged between the first semiconductor layer and the second semiconductor layer, and the first cavity extends from the handle wafer to the third semiconductor layer.

8. The structure of claim 1 further comprising:
a third semiconductor layer arranged between the first semiconductor layer and the handle wafer,
wherein the first semiconductor layer is comprised of a first semiconductor material, and the third semiconductor layer is comprised of a second semiconductor material that is capable of being etched and removed selective to the first semiconductor material.

9. The structure of claim 8 further comprising:
a plurality of second cavities arranged in the third semiconductor layer.

10. The structure of claim 9 further comprising:
a plurality of trench isolation regions extending through the first semiconductor layer and the third semiconductor layer, the plurality of trench isolation regions surrounding the first semiconductor layer, the third semiconductor layer, and the plurality of second cavities.

11. The structure of claim 8 further comprising:
a plurality of trench isolation regions extending through the first semiconductor layer and the third semiconductor layer, the plurality of trench isolation regions surrounding the first semiconductor layer and the third semiconductor layer.

12. The structure of claim 11 wherein the first cavity extends from the handle wafer to the third semiconductor layer.

13. The structure of claim 1 wherein the device structure is a switch field-effect transistor, and the first cavity is arranged in the second semiconductor layer directly beneath the switch field-effect transistor.

14. A structure comprising:
a first semiconductor layer;
a device structure arranged at least in part in the first semiconductor layer;
a handle wafer;
a second semiconductor layer arranged between the handle wafer and the first semiconductor layer;
a dielectric layer including a section arranged between the handle wafer and the second semiconductor layer;
a bonding layer configured to attach the handle wafer to the section of the dielectric layer;
a first cavity arranged between the handle wafer and the first semiconductor layer, the first cavity extending completely through the second semiconductor layer and the section of the dielectric layer, and the first cavity having an arrangement in the second semiconductor layer beneath the device structure; and
a third semiconductor layer arranged between the first semiconductor layer and the second semiconductor layer,
wherein the first cavity extends from the handle wafer to the third semiconductor layer.

15. A structure comprising:
a first semiconductor layer;
a device structure arranged at least in part in the first semiconductor layer;
a handle wafer;
a second semiconductor layer arranged between the handle wafer and the first semiconductor layer;
a dielectric layer including a section arranged between the handle wafer and the second semiconductor layer;
a bonding layer configured to attach the handle wafer to the section of the dielectric layer;
a first cavity arranged between the handle wafer and the first semiconductor layer, the first cavity extending completely through the second semiconductor layer and the section of the dielectric layer, and the first cavity having an arrangement in the second semiconductor layer beneath the device structure; and
a third semiconductor layer arranged between the first semiconductor layer and the handle wafer,
wherein the first semiconductor layer is comprised of a first semiconductor material, and the third semiconductor layer is comprised of a second semiconductor material that is capable of being etched and removed selective to the first semiconductor material.

16. The structure of claim 15 further comprising:
a plurality of second cavities arranged in the third semiconductor layer.

17. The structure of claim 16 further comprising:
a plurality of trench isolation regions extending through the first semiconductor layer and the third semiconductor layer, the plurality of trench isolation regions surrounding the first semiconductor layer, the third semiconductor layer, and the plurality of second cavities.

18. The structure of claim 15 further comprising:
a plurality of trench isolation regions extending through the first semiconductor layer and the third semiconductor layer, the plurality of trench isolation regions surrounding the first semiconductor layer and the third semiconductor layer.

19. The structure of claim 18 wherein the first cavity extends from the handle wafer to the third semiconductor layer.

20. The structure of claim 15 wherein the first semiconductor material is silicon, and the second semiconductor material is silicon germanium.

* * * * *